United States Patent [19]

Herrig et al.

[11] Patent Number: 4,835,737

[45] Date of Patent: May 30, 1989

[54] METHOD AND APPARATUS FOR CONTROLLED REMOVAL AND INSERTION OF CIRCUIT MODULES

[75] Inventors: Hanz W. Herrig, Aurora, Ill.; David N. Horn, Rumson, N.J.; Daniel V. Peters; Randy D. Pfeifer, both of Warrenville, Ill.; Wayne R. Wilcox, Naperville, Ill.

[73] Assignees: American Telephone and Telegraph Company, AT&T Bell Laboratories, Murray Hill; AT&T-Information Systems, Holmdel, both of N.J.

[21] Appl. No.: 888,498

[22] Filed: Jul. 21, 1986

[51] Int. Cl.⁴ .................. G06F 13/00; G06F 13/38; G06F 13/40

[52] U.S. Cl. .................. 364/900; 364/929.4; 364/929.5

[58] Field of Search ... 364/200 MS File, 900 MS File; 361/397, 399, 401, 412, 413, 414, 1, 58, 9

[56] References Cited

U.S. PATENT DOCUMENTS

| | | | |
|---|---|---|---|
| 2,908,775 | 10/1959 | Gilbert | 200/2 |
| 3,191,095 | 1/1961 | Hefti | 317/9 |
| 3,573,558 | 4/1971 | Babcock | 361/399 |
| 3,710,197 | 1/1973 | Olds et al. | 317/118 |
| 3,932,716 | 1/1976 | Mottel et al. | 200/50 |
| 3,993,935 | 11/1976 | Phillips et al. | 361/397 |
| 4,071,722 | 1/1978 | Hart | 200/50 |
| 4,144,565 | 3/1979 | Bouknect et al. | 364/200 |
| 4,245,270 | 1/1981 | Busby | 361/58 |
| 4,418,971 | 12/1983 | Liss | 339/17 |
| 4,454,552 | 6/1984 | Barnes et al. | 361/58 |
| 4,502,116 | 2/1985 | Fowler et al. | 364/200 |
| 4,507,697 | 3/1985 | Ozil et al. | 361/1 |
| 4,675,769 | 6/1987 | Marshall et al. | 361/1 |
| 4,695,914 | 9/1987 | Ohtsuki et al. | 361/1 |

Primary Examiner—Thomas Heckler
Assistant Examiner—Joseph T. Fitzgerald
Attorney, Agent, or Firm—Peter Visserman

[57] ABSTRACT

An electronic circuit board electrically connected to other circuits of a data processing system by means of a bus, may be removed and re-inserted in the system without the necessity of disabling other circuits connected to the bus. A latch actuated switch provides a control signal in anticipation of circuit board removal. The control signal activates a finite state machine which seizes control of the bus after completion of any current bus communications and stops the generation of clock pulses normally required in bus communications. When contact is physically broken between the board and its corresponding connector, the finite state machine restores the bus clock pulses and relinquishes control of the bus. When a board is to be inserted in an open connector, contact between the board and the connector is sensed by the finite state machine which causes the bus to be seized and the bus clock pulses to be temporarily inhibited. When the board is fully inserted, the finite state machine restores the bus clock pulses and relinquishes control of the bus.

20 Claims, 3 Drawing Sheets

METHOD AND APPARATUS FOR CONTROLLED REMOVAL AND INSERTION OF CIRCUIT MODULES

TECHNICAL FIELD

The invention relates to electronic circuit modules and particularly to a method and apparatus for removal and insertion of circuit modules from and into connectors forming part of an electronic circuit arrangement.

DESCRIPTION OF THE PRIOR ART

Electronic circuit modules such as circuit boards and other component carriers are commonly connected to other circuits by means of a bus and connectors in which the circuit modules may be inserted. It is well known that removal of a circuit module from a connector in an active system may cause arcing at the connector and in the prior art, switches are mounted on circuit boards to remove electrical power from the board during removal and insertion of the board from and into an associated connector. Circuit boards usually have communication and interaction with other circuits by means of a backplane bus arrangement to which connectors are connected. The abrupt disconnection or connection of power to a board so connected to the bus tends to cause electrical transients on the bus. Such a disturbance on the bus is likely to cause error conditions to occur throughout the circuits connected to the bus. It is therefore not uncommon to shut down operations of a whole system when one board has to be removed or inserted. A problem in prior art systems is that such a procedure requires a reinitialization of the complete interconnected system or subsystem and a restoration of interrupted bus communications when the power is restored. Clearly, such shutting down and reinitializing is interruptive and time consuming. It is particularly disadvantageous in multiprocessor systems wherein the several processors function independently and the system operates normally with certain boards removed.

SUMMARY OF THE INVENTION

These and other problems of the prior art are solved and an advance is made in accordance with this invention in a system wherein circuit modules are interconnected by a bus, by inhibiting the operation of the bus during the period that a module is being inserted or removed from a connector connected to the bus and reactivating the bus after the module has been inserted or removed. In the removal of a module from its associated connector, a switch on the module is operated to provide an inhibit signal via the associated connector to a control circuit which inhibits operation of the bus. As the module is removed from its associated connector, the inhibit signal is deactivated causing the control circuit to again enable the bus for the performance of normal bus functions for the remaining modules of the system. Similarly, when a module is to be inserted in an associated connector, the switch on the module will be positioned such that the inhibit signal is transmitted via the associated connector to the control circuit. In response, the control circuit inhibits operation of the bus. Upon full insertion of the module in the associated connector, the switch is operated to a second state in which the inhibit signal to the control circuit is deactivated. As a consequence, the control circuit again enables the bus to perform normal operations. Advantageously, this procedure causes at most a transmission delay for other circuits attempting to transmit over the bus during the idled periods but does not in any way interfere with any other operation of any of the circuitry connected to the bus. In one particular embodiment of the invention, the control circuit in response to the inhibit signal seizes control of the bus and halts the clock signals which control the operation to the bus, thus preventing any other circuits from seizing or transmitting data on the bus. When the inhibit signal is deactivated, the clock pulses will be restarted and the bus will again be available to all circuits connected to it. Advantageously, this arrangement does not interfere with the operation of any circuits other than those on the affected module except for possible bus access delays and avoids the necessity of a lengthy power down and reinitialization procedure.

In one particular embodiment the connectors in which circuit boards are inserted are each equipped with a pair of extra length pins at the top and at the bottom of the connector. The longer pins are connected to the actuator operated switch and this arrangement assures that contact is made with these pins before other pins. Furthermore, in one embodiment the switch is a double throw switch having one connection for sending a power unit inhibiting signal to the power supply associated with the board and an opto-isolator connected across the switch. An initial opening of the switch on a fully inserted board does not affect operation of the power supply unit since this switch is short circuited by the opto-isolator. However, after the bus control clock pulses have been appropriately inhibited, a signal is transmitted by the control circuit to the opto-isolator, thereby opening the path and causing the power supply unit to be shut down. When a board is inserted in a connector, the opto-isolator control signal is set to such a state that the opto-isolator will be in the open state when the board is first inserted. Upon complete insertion of the board and operation of the switch, the power control path will be closed causing the power supply to provide power to the newly inserted board.

BRIEF DESCRIPTION OF THE DRAWING

The invention may be better understood from the following detailed description of an illustrative embodiment of the invention, taken together with the drawing in which.

DETAILED DESCRIPTION

Figure 1:
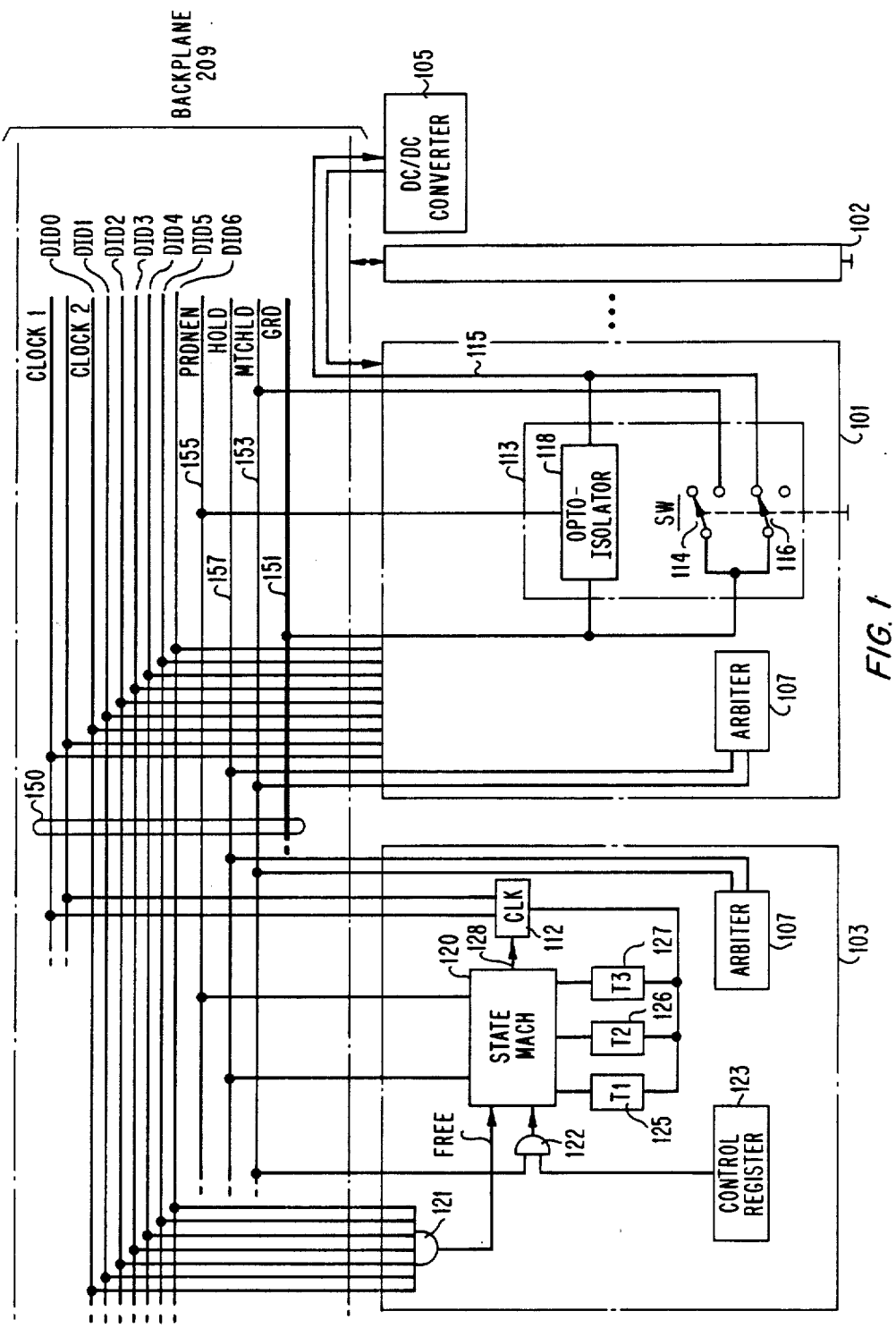
FIG. 1 is a block diagram representation of a lever actuated switch on a circuit board connected to a bus and control circuitry for controlling the bus during insertion and removal of the circuit board.
Figure 2:
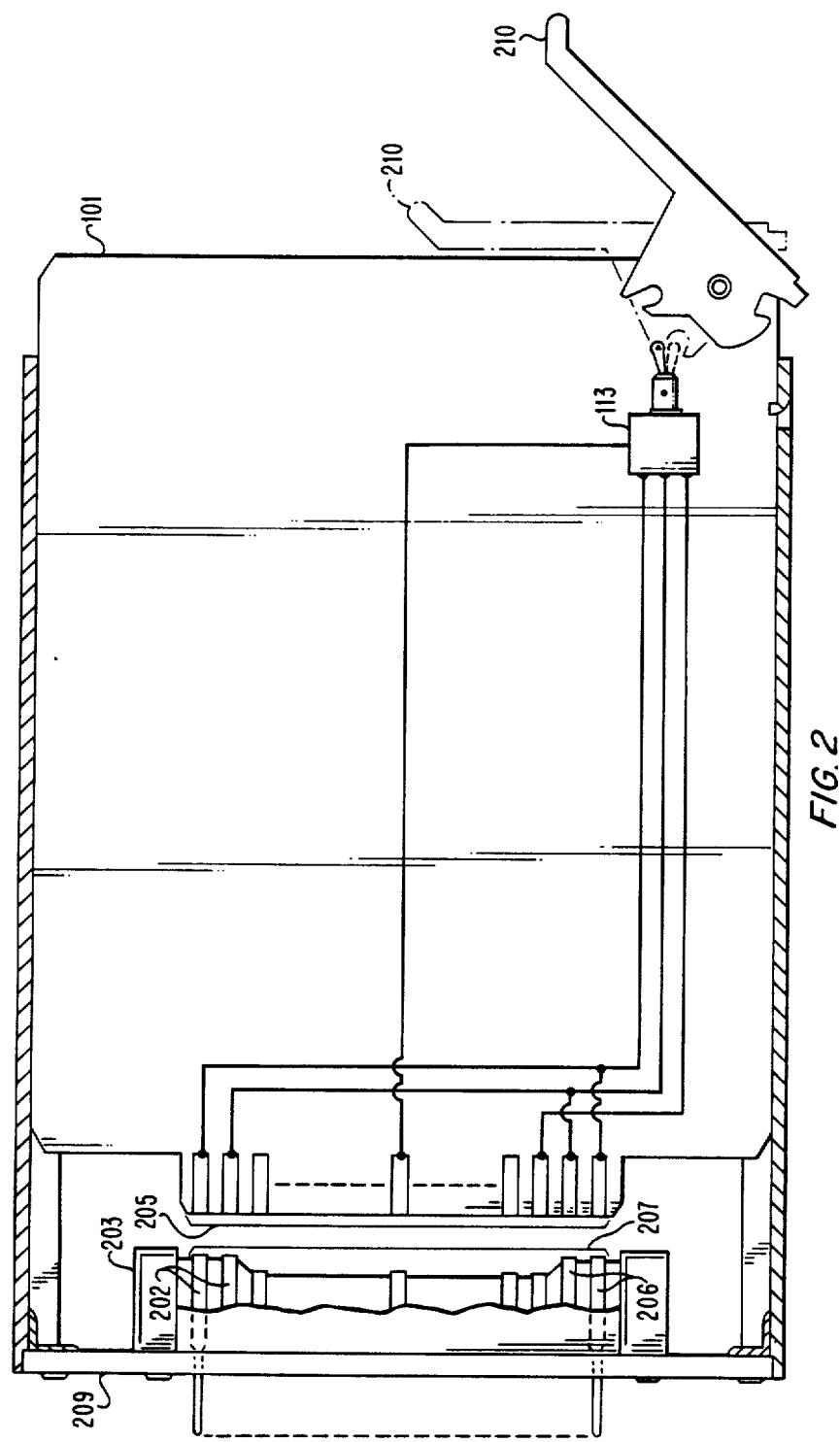
FIG. 2 is a schematic representation of a connector and a circuit board with a lever actuated switch.

FIG. 1 is a representation of a multiple conductor bus 150 and a plurality of circuit boards 101 and 102, as well as control circuitry on circuit board 103. The boards shown are modules representative of a number of boards plugged into a backplane and connected to the bus 150 on the backplane by means of circuit board connectors as depicted in FIG. 2. The circuit boards connected to the bus 150, will normally include the circuitry shown on board 101 as well as numerous other circuit elements and other connections to the bus. The boards may, for example, be bus interface boards providing an interface from processors or controllers to the bus. The additional connections and circuits on the boards are not shown in the drawing since they are not required for an understanding of the invention. The bus 150 is viewed as a multiple conductor bus which may be a standard bus such as the well-known Multibus II or the S-100 bus defined as an IEEE standard. Communication between the circuit boards connected to the bus takes place via these conductors which will include address leads in addition to data and other control leads. The address leads in this particular illustrative embodiment are identified as destination ID (DID) leads 0 through 6. Since a number of units communicate via this bus, an arbitration scheme is provided. This may be a well known arbitration scheme such as, commonly used for example, with the Multibus II or the S-100 bus. In this illustrative system, each circuit board is provided with an arbiter circuit 107 which, by monitoring several bus leads, determines when it is entitled to bus access. When a circuit has gained access to the bus it will assert the HOLD lead, which is one of the control leads of bus 150, to notify other circuits that the bus is occupied.

The control board 103 is shown as a convenient arrangement for housing bus control circuitry activated in connection with the removal and insertion of one of the circuit boards 101. This control circuitry will normally be only a part of the circuitry on the board. A DC to DC converter 105 supplies electrical power to circuit board 101 in a standard fashion. A similar power supply connection not shown in the drawing exists for board 103 and other circuit boards connected to the bus.

Shown as part of board 101 in FIG. 1 is a double-pole, double-throw switch 113, having contacts 114 and 116. This switch is actuated to its open and closed position by means of a latch 210 shown in FIG. 2. When the board is fully inserted in its associated connector, the latch 210 is in the closed position shown in broken lines in FIG. 2. In this position switch contact 114 is open and contact 116 is closed. In preparation for removal of a board from its connector and prior to insertion of the board into the connector, latch 210 is operated to the open position, shown in solid lines in FIG. 2. In the open state of the latch, contact 114 is closed and contact 116 is open. The closing of the contact 114 causes a connection to be established between the ground lead 151 and the MTCHLD lead 153 of the bus 150. This is equivalent to placing a logical 0 on the MTCHLD lead. As will be discussed further in subsequent paragraphs, the assertion of this lead is used to initiate action of the circuitry on the control board 103.

In the closed state of the latch 210, contact 116 provides a connection from ground lead 151 to a control input of the DC to DC converter 105 via control lead 115. The DC to DC converter is a standard power supply circuit which is responsive to the state of control lead 115 and ceases to provide power to the board 101 when this ground connection via lead 115 is opened. A single power supply may be provided for each of the boards 101 connected to the bus 150. Alternatively, a shared power supply may be used which may be disconnected individually from each of the boards. An opto-isolator 118 is connected across switch contact 116. The opto-isolator is a commercially available optical device which may be electrically controlled to present either an open electrical circuit or a closed electrical circuit. The opto-isolator, as will be discussed in subsequent paragraphs is controlled from the control board 103 and provides a current path between the terminals of switch contact 116 when it is opened by operation of the latch 210 to the open position in anticipation of removal of the board. A control signal from control board 103 opens the path through the opto-isolator at the appropriate time.

FIG. 2 shows a representation of the circuit board 101 which may be pluggably engaged with a circuit board connector 203 shown in a partial cutaway view. A plurality of contacts 205 on board 101 are arranged to be engaged with a number of connector pins 207 of the connector 203. The connector 203 is fastened to a backplane 209 and pins 207 extend through the backplane and connections may be made to the pins in a standard fashion by wire wrap or printed circuitry interconnections on the backplane. The bus 150 (not shown in FIG. 2) physically resides on the backplane 209. Circuit board 101 is equipped with a latch 210 which is shown in the open or actuated position in solid lines and in the closed position in dotted lines. The latch operates toggle switch 113, depicted in circuit diagram form in FIG. 1, to its normal on position when the latch is closed and to its normal off position when the latch is opened. The switch 113 is connected by so-called printed wiring conductors to certain of the contacts 205 and via pins 207 to the backplane 209 when the board is inserted in the connector 203. The switch 113 further includes the opto-isolator 118 shown in FIG. 1. FIG. 2 shows that the uppermost pair of pins 202 and the lowermost pair of pins 206 of the set of pins 207 is longer, for example one eighth of an inch longer, than other pins of the connector. One pin of the upper pair 202 and one pin of the lower pair 206 are connected to the ground lead 151 (FIG. 1) and the other pins of the two pairs are connected to the MTCHLD lead 153 (FIG. 1). The corresponding contacts on board 101 are connected in parallel, as shown in FIG. 2, and on the backplane 209 as well. The purpose of the longer pins is to assure that electrical contact is made between these pins and the corresponding ones of the contacts 105 before other pins. That assures a proper sequence of events, as the board is removed or inserted, as will be discussed later herein.

Figure 3:
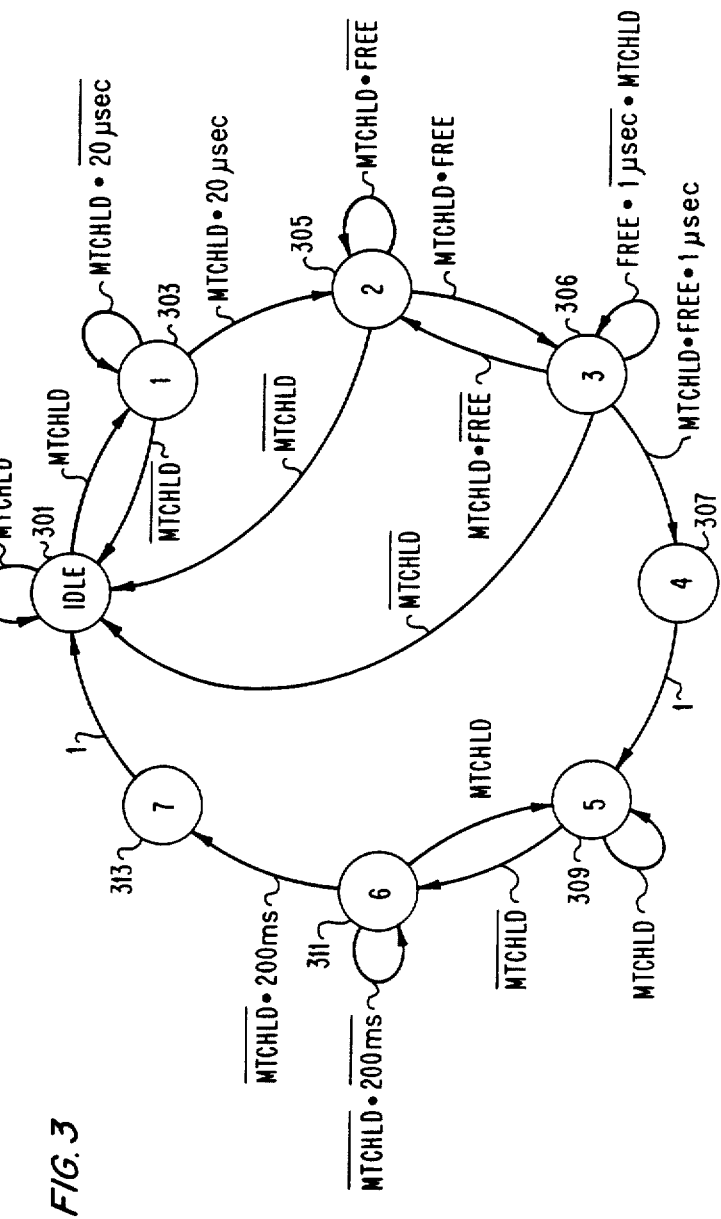
FIG. 3 is a state diagram of the control circuitry of FIG. 1.

FIG. 3 is a state diagram representing the functions of the state machine 120 of FIG. 1 which is part of the control circuitry on board 103. The sequence of functions depicted in FIG. 3 are carried out in connection with the insertion and removal of a circuit board 101. State machine 120 consists of sequential logic circuitry for performing the sequencing function defined by the state diagram of FIG. 3. It may be readily implemented using standard logic circuit building blocks. The state machine 120 receives input signals from the MTCHLD lead 153, timing circuits 125, 126, and 127, from AND gate 121 and AND gate 122. It generates control signals to clock circuit 112, to HOLD lead 157 and to the power down enable (PRDNEN) lead 155. A control register 123 contains a bit for selectively enabling the AND gate 122. The clock circuit 112 may be any of a number of well-known clock circuits capable of generating bus clock pulses. In this illustrative system, two pairs of clock pulses, CLOCK1 and CLOCK2, 90 degrees out of phase are provided on bus 150 to enable various circuits connected to the bus to communicate on the bus at the bus clock rate. Specifically, these clock leads are used in access circuitry (not shown) in each of the circuits connected to the bus. Communications on the bus are inhibited under control of the state machine 120 by inhibiting the CLOCK1 and CLOCK2 leads, thereby preventing access to the bus and thus isolating the connected circuits from any transients which may occur on the bus during insertion and removal of a bus connected circuit board. This inhibiting of the CLOCK1 and CLOCK2 leads will not affect the operations of other clock circuits (not shown) on board 103, such as the clock circuits which control operation of the state machine 120. Neither does this inhibiting interfere with other clocked operations on any other bus connected circuit boards. This feature allows other circuits to continue to perform functions which do not require bus access and allows the entire system to resume operation without reinitialization when the signals on the CLOCK1 and CLOCK2 leads are restored.

As mentioned above, operation of the latch 210 to the open position, which is indicated in solid lines in FIG. 2, causes switch contact 114 to close and switch contact 116 to open. If the circuit is fully inserted in its associated connector, a logical 0 is asserted on the MTCHLD lead 153 of the bus 150 via switch contact 114 when the latch is opened. If, on the other hand, the board is being inserted with the latch in the open position, the signal is applied to the MTCHLD lead when the appropriate contacts 205 make electrical contacts with either of the two pairs of long pins 202 and 206 during the insertion process.

The signal on the MTCHLD lead is propagated through AND 122 if an appropriate enable bit is set in control register 123. This enable bit is provided to control the response of the state machine to the MTCHLD signal. The state machine 120 which is initially in an idle state represented by block 301 in FIG. 3, responds to the signal from AND gate 122 by making a transition to state 1 in block 303 as shown in FIG. 3. Upon entry into this state, T1 timer 125, which is a 20 microsecond timer, is initiated and the state machine remains in state 1 until the 20 microsecond period has lapsed. This is done to avoid starting the process due to transient signals which may appear on the MTCHLD lead. If the MTCHLD signal is negated during this period, a return is made to the idle state. Upon expiration of the 20 microseconds in state 1, a transition is made to state 2 in block 305. In this state, the HOLD lead 157 is asserted by the state machine 120. This is done even though the HOLD lead may already be asserted by another circuit on the bus, since the assertion of the HOLD lead by the control circuitry prevents other circuits from attempting to seize the bus upon completion by any current user of the bus. The state machine, however, will not take any action to inhibit the bus until it has been relinquished by any current user. To that end, the bus address leads DID0 through DID6 are monitored by means of AND gate 121. In this illustrative system, activity on the bus is indicated by a logical '0' on one of the DID leads. Thus, AND gate 121 provides a logical '1' output to the state machine on the lead labeled FREE when the bus is free. Upon the concurrence of the logical '1' on the FREE lead and an indication that the MTCHLD lead is still activated, a transfer is made to state 3, block 306 of FIG. 3. If the MTCHLD lead becomes deactivated at any time while in state 1, 2 or 3 a return is made to the idle state. A return is made from state 3 to state 2 if for any reason the FREE lead is negated. Upon entry in state 3, the T2 timer 126, which is a 1 microsecond timer, is activated. After 1 microsecond a transition is made to state 4, block 307 of FIG. 3. The 1-microsecond delay is used to assure that the bus is indeed free before inhibiting the bus.

In block 307 the bus is inhibited by means of a stop-clock signal from the state machine 120 to the clock circuit 112 on conductor 128. This signal results in a deactivation of the clock pulses on the bus clock leads CLOCK1 and CLOCK2. This deactivation will prevent any other circuits from responding to transients which may occur on the bus since the bus access circuitry of any circuits connected to the bus is dependent on these clock signals. Subsequent to the generation of the stop-clock signal, in a subsequent cycle of the state machine, a transition is made in the state machine to state 5, block 309, in which a power-down enable signal will be applied to the PRDNEN lead 155. This signal is applied to the opto-isolator 118 of board 101, and like opto-isolators of all circuit boards connected to the bus, causing each opto-isolator to present an open circuit. During removal of a board, switch contact 116 will have been opened by the opening of the latch 210 and thus, application of the control signal to the associated opto-isolator causes an open circuit at the switch. Other boards for which the latches remain closed, will not be affected by the opening of the opto-isolator devices. For the board being removed, there is an interruption in the path from the ground lead 151 to the associated DC to DC converter power supply 105. This in turn shuts down the power supply. At this point the board may be removed without causing arcing or causing unforeseen electrical transients in the circuitry. During insertion of a board, the latch 210 and switch contact 116 are in the open position. Likewise, the opto-isolator is in the open position and thus, the signal on the PRDNEN lead will have no effect on the opto-isolator of the board being inserted.

The progress from the idle state in block 301 through state block 309, takes less than 200 milliseconds. Thus, the shutdown of power to a board to be removed takes place after initial operation of the latch but before the human operator will have had an opportunity to disengage the circuit board from its connector. The state machine remains in the power-down state 5 as long as the MTCHLD lead remains asserted, that is, as long as there is a path through the circuit board and switch contact 114. Both the MTCHLD lead 153 and the GRD lead 151 are connected to the board via the two pairs of extra long pins 202 and 206 of connector 203. Thus, during board removal, the signal on the MTCHLD lead is negated only after all other connector pins have been disconnected from the board. When a board is being inserted, the latch 210 is closed as part of the manual board insertion operation.

When that happens, switch contact 114 opens and switch contact 116 closes. Consequently, the signal on the MTCHLD lead is negated, and the power supply control signal is asserted on conductor 115, causing the DC to DC converter 105 to apply power to the newly inserted board in a standard fashion. Negation of the MTCHLD signal causes a transition to be made from state 5 to state 6, block 311 in FIG. 3. A transition may be made back to state 5 in case of spurious signals on the MTCHLD lead resulting from the removal of the board. Upon entry into state 6, a T3 timer 127, which is a 200 millisecond timer, is initiated. This timer is used to assure that a clean disconnect has been made in the case of removal of a board, and to allow sufficient time for power to be properly applied to the board in the case of board insertion. Upon the elapse of this time period a transition is made to state 7, block 313 in FIG. 3, in which the HOLD lead 157 of bus 150 is released. Furthermore, the PRDNEN lead is negated in state 7 thereby enabling the opto-isolators of all the boards. In a subsequent cycle of the state machine, a transition is made to the idle state 301, in which the stop-clock signal on conductor 128 is released allowing the clock circuit 112 to again produce the bus clock pulses on leads CLOCK1 and CLOCK2. At this point the bus is available for use by all of the circuits connected thereto. In the meantime, however, none of the operations of the other circuits has been interfered with other than those resulting from a denial of access to the bus.

It is to be understood that the above-described arrangement is merely an illustrative application of the principles of the invention. Various changes and modifications may be devised by those skilled in the art without departing from the spirit and scope of the invention.

What is claimed is:

1. In combination: a data transmission bus circuit; a plurality of connectors connected to said bus circuit; clock circuit means for providing bus access clock pulses to said connectors; control circuit means connected to said clock circuit means, to each of said connectors and to said data transmission bus circuit for controlling access to said bus circuit; and a circuit module removably inserted in one of said connectors comprising switch means having a predefined state for transmitting a control signal via said one connector to said control circuit means when operated to said predefined state in preparation for removal of said module from said one connector; said control circuit means responsive to inhibit said clock circuit means in the presence of said control signal, thereby preventing access to said bus circuit from any of said connectors and to enable said clock circuit means in response to interruption of said control signal upon removal of said board, thereby allowing access to said bus from said connectors; whereby access to said bus is inhibited when said switch means is operated to said predefined state in preparation for removal of the module and access to the bus is allowed when the board has been removed and the connection from the switch via said one connector in the control circuit has been broken.

2. The combination in accordance with claim 1 and further comprising a power supply circuit connected to said switch means for supplying electrical power to said module and responsive to said switch means operated to said predefined state to disconnect power to said module.

3. The combination in accordance with claim 1 wherein said module further comprises conductors and said connector comprises a plurality of pins for engagement with conductors on said module, certain of said pins designated for engagement with conductors connected to said switch, said certain pins being longer than other of said plurality of pins to assure that contact is maintained longer with said certain pins than with said other pins during removal of said module and to assure that contact is made with said certain pins before contact is made with said other pins during insertion of said module.

4. An electrical circuit arrangement comprising: a plurality of connectors each for removably engaging a circuit module comprising circuits for generating control signals; a data transmission bus connected to said connectors for the transmission of data between said connectors; clock circuit means for providing bus access clock pulses to said connectors; control circuit means connected to each of said connectors and to said bus and including bus access circuit means for determining bus access entitlement, said control circuit means responsive to a predetermined control signal from a circuit module engaging any one of said connectors to inhibit said clock circuit means after gaining bus access entitlement, thereby preventing the transmission of data between said bus and any of said connectors for as long as said predetermined signal is present.

5. The circuit arrangement in accordance with claim 4, further comprising a power supply circuit connected to one of said connectors for supplying power to a circuit module engaging said one connector and responsive to a first control signal from a circuit module engaging said one connector to supply power to said one connector and responsive to a second control signal from said control circuit means to inhibit the supplying of power only to said one connector.

6. The arrangement in accordance with claim 5, wherein said control circuit means generates said second control signal while inhibiting transmission of data on said bus when a circuit module is being removed from engagement with one of said connectors and said control circuit means is responsive to cessation of said predetermined control signal to release inhibit of said clock circuit means a period of time after said cessation sufficient to allow said power supply circuit to respond to said first control signal when a circuit is brought into engagement with one of said connectors.

7. In an electrical circuit comprising a plurality of circuit modules, a bus for interconnecting said plurality of circuit modules, power supply means for supplying electrical power to said modules, and circuit means for controlling access to said bus, the method of powering down one of said circuit modules comprising the steps of:

a. transmitting a control signal from said one module to said circuit means for controlling said circuit means;

b. in response to said control signal, seizing said bus by said circuit means upon completion of a bus transaction by another of said plurality of circuit modules;

c. controlling said bus to prevent the transmission of signals between said bus and any of said plurality of circuit modules; and;

d. thereafter, disconnecting said one circuit module from said power supply means under control of said circuit means.

8. In an electrical circuit comprising a plurality of connectors connected to a data transmission bus, a plurality of circuit modules for insertion in said connectors, a control circuit, and clock circuitry for generating bus access clock pulses for controlling communications between said connectors and said bus, the method of controlling said electrical circuit during insertion and removal of said modules into and from said connectors comprising the steps of:

a. generating a control signal to said control circuit prior to insertion and removal of a first selected one of said modules;

b. in response to said control signal, first seizing control of said bus by said control circuit upon completion of a bus transaction by another of said plurality of circuit modules to prevent access to said bus by any of said modules, and secondly disabling said clock circuitry to prevent communications between said connectors and said bus;

c. generating a second control signal to said control circuit upon completion of insertion or removal of said selected module; and d. relinquishing control of said bus by said control circuit and enabling said clock circuitry in response to said second control signal.

9. In a data processor having a plurality of removable circuit modules each having a plurality of conductors, a plurality of connectors for supporting said modules and each of said connectors comprising a plurality of conductors for engaging conductors of modules supported therein, a data transmission bus interconnecting said connectors, clock circuitry for providing bus access clock pulses controlling communications between said connectors and said bus, and power supply circuitry for supplying electrical power to said connectors, an arrangement for controlling operation of said bus during insertion and removal of circuit modules into and from said connectors, comprising: a control circuit; switch means on each of said modules; said switch means connectable to said power supply circuitry and to said control circuit via conductors on said modules and on said connectors and operable to a first state to activate a control signal and to a second state to deactivate said control signal; said control circuit being responsive to activation of said control signal supplied via one of said connectors to first inhibit said clock circuitry from providing said clock pulses to said connectors thereby inhibiting communication between said bus and any of said plurality of connectors, and to subsequently inhibit said power supply circuitry from supplying power to said one connector; said control signal being deactivated upon disengagement of conductors of a module from conductors of said one connector during module removal and upon operation of said switch means on a module in said one connector to said second state during module insertion; said switch means on said module in said one connector transmitting a power control signal to said power supply circuitry when operated to said second state; said power supply circuitry responsive to said power control signal to supply power to said one connector, and said control circuit being responsive to said deactivation of said control signal to generate an enable signal to enable said clock circuitry to provide said clock pulses to said connectors.

10. An electrical circuit comprising:

a plurality of removable circuit boards;

a plurality of connectors for pluggably engaging said boards;

a system ground contact point connected to said connectors;

a data transmission bus interconnecting said connectors;

a clock circuit for providing bus access clock pulses to said connectors;

power supply circuitry for supplying electrical power to each of said boards;

a control circuit located remote from said removable circuit board;

switch means on each of said boards connected to said power supply circuitry, said ground contact point, and said control circuit by means of said connectors and having a first state and a second state wherein said switch in said second state provides a closed path from said ground contact point to said control circuit;

said control circuit being responsive to. said switch means on one of said boards being operated from said first state to said second state to inhibit said clock circuit, thereby preventing the transmission of signals between said bus and any of said connectors and to subsequently inhibit said power supply circuitry from supplying power to said one board and said control circuit being further responsive to a breaking of said closed path through said switch caused by removal of said one board from a corresponding connector to generate a clock enable signal to said clock circuit.

11. The circuit in accordance with claim 10 wherein said switch means presents a closed path from said ground contact point to said power supply in said first state to enable said power supply circuitry, and each of said boards further comprises an opto-isolator connected to said switch means for providing a short circuit across said switch in said path to said power supply circuitry; said opto-isolator responsive to a control signal to provide an open circuit across said switch means; and wherein said control circuit provides said control signal to said opto-isolator on said one board in response to said switch on said one board being operated to said second state to inhibit said power supply circuitry from supplying power to said one board.

12. The circuit in accordance with claim 10 and further comprising bus arbitration circuitry connected to said switch on each of said boards and responsive to said switch on said one board being operated to said second state to inhibit further data transmission activity on said bus upon completion of a bus transaction by another of said boards; and wherein said control circuit is responsive to the cessation of further data transmission on said bus to inhibit said clock circuitry.

13. A bus structure comprising:

a plurality of connector means for receiving and retaining circuit modules;

a transmission bus connected to said connector means for performing transmission operations between said connector means;

clock circuit means for providing bus access clock pulses to each of said connectors;

control circuit means connected to said connector means and said clock circuit means and responsive to a first control signal from one of said connector means indicating insertion or removal of a circuit module in said one connector means for inhibiting said clock circuit means from providing said bus access clock pulses to said plurality of connector means thereby preventing transmission of signals between any of said connector means and said transmission bus and responsive to a second control signal indicating completion of insertion or removal of a circuit module in said one connector means to enable said clock circuit means.

14. The bus structure in accordance with claim 13 wherein said transmission bus may be selectively occupied by circuit modules connected thereto and said bus structure comprises bus occupancy sensing means for controlling said control circuit means to inhibit said clock circuit means ony when said bus is not occupied.

15. The bus structure in accordance with claim 13 and comprising inhibit control means for selectively inhibiting said first control signal, whereby said control circuit means is selectively prevented from inhibiting operation of said bus.

16. The bus structure in accordance with claim 13 further comprising power supply circuit means for providing electrical power to circuit modules in said connector means and wherein said control circuit means is further responsive to said first control signal to selectively inhibit said power supply circuit from providing power to circuit modules in said connector means.

17. A pluggable circuit module for pluggably engaging one connector having a plurality of conductors, said one connector connected to a bus structure including a transmission bus for performing transmission operations between a plurality of connectors and clock circuit means for providing bus access clock signals to said connectors; said module comprising conductors for engagement with said conductors of said one connector and switch means operable to a first state for providing a signal path on said module between certain conductors of said one connector for the transmission of a clock inhibit signal via said one connector to said clock circuit means for preventing transmission of signals from said bus to said connectors during such time as there exists electrical contacts between conductors of said module and said certain conductors of said one connector; said switch means operable to a second state to break said signal path to deactivate said clock inhibit signal, thereby enabling said bus operations when said module is in engagement with said connector and said switch is in said second state.

18. In combination, a bus circuit for interconnecting a plurality of circuit modules;
connector means connected to said bus for pluggably engaging circuit modules;
said bus circuit including a control conductor for connection to clock circuit means for providing bus access clock signals to said connectors;
switch means on at least one of said modules connected via one of said connectors to said control conductor and having at least one operational state, said switch operable to said one state to transmit a control signal on said conductor to inhibit said clock circuit means for preventing transmission of signals from said bus to other modules during disconnection of said one module from said bus for as long as said one module is in engagement with said one connector, said signal being terminated to enable said clock circuit when said module is disengaged from said one connector.

19. The combination in accordance with claim 18, wherein said switch means has a second state and when operated to said one state transmits said control signal on said conductor to prevent transmission of signals from said bus to other modules while said one module is being inserted in said one connector, said control signal being terminated when said switch is operated to said second state.

20. A bus control circuit for use with a bus structure comprising a transmission bus, a plurality of connectors for connecting a plurality of circuit modules to said bus, a clock circuit for providing bus access clock pulses to said connectors and power supply circuitry for supplying power to each of said connectors, said control circuit responsive to a bus control signal from one of said connectors for first generating a first inhibit signal for preventing access to said bus by any of said connectors upon completion of bus occupancy from any of said connectors, secondly, generating a second control signal subsequent to said first control signal to inhibit said clock circuit thereby preventing any of said modules from receiving signals from said bus, thirdly, generating a third control signal subsequent to said second control signal for disabling said power supply from supplying power to said one connector.

* * * * *